(12) United States Patent
Somerstein et al.

(10) Patent No.: US 8,413,080 B1
(45) Date of Patent: Apr. 2, 2013

(54) BINARY HALF-TONE PHOTOLITHOGRAPHIC OPTICAL APODIZATION MASK

(75) Inventors: Stephen F. Somerstein, Mountain View, CA (US); Martina J. Reale, Palo Alto, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 1984 days.

(21) Appl. No.: 11/212,749

(22) Filed: Aug. 29, 2005

(51) Int. Cl.
*G06F 17/50* (2006.01)

(52) U.S. Cl. .......................................... 716/51
(58) Field of Classification Search ................ 716/1, 51
See application file for complete search history.

(56) References Cited

U.S. PATENT DOCUMENTS

| | | | | |
|---|---|---|---|---|
| 4,841,492 A | * | 6/1989 | Russell | 367/105 |
| 5,542,031 A | * | 7/1996 | Douglass et al. | 358/1.15 |
| 5,790,704 A | * | 8/1998 | Rao et al. | 382/237 |
| 6,282,963 B1 | * | 9/2001 | Haider | 73/602 |
| 6,574,395 B1 | * | 6/2003 | Mechin et al. | 385/37 |
| 7,095,504 B1 | * | 8/2006 | Ames et al. | 356/498 |

OTHER PUBLICATIONS

Liu et al. "Binary and Phase Shift Mask Design for Optical Lithography", May 1992, IEEE Transactions on Semiconductor Manufacturing, vol. 5, No. 2, pp. 138-152.*
Liu et al., "Computer-Aided Phase Shift Mask Design with Reduced Complexity", May 1996, IEEE Transactions on Semiconductor Manufacturing, vol. 9, No. 2, pp. 170-181.*

* cited by examiner

*Primary Examiner* — Suresh Memula
(74) *Attorney, Agent, or Firm* — McDermott Will & Emery LLP

(57) ABSTRACT

A method for creating an apodization mask is disclosed. According to the method, a grid is created for the pattern. The grid includes a number of elements. Each element is processed to determine whether the element is to be made transmissive based on a predetermined local optical density and a random value. The predetermined local optical density and the random value are associated with the element. The random value is generated on a random basis. Each element is further processed to determine whether the position of the element is to be shifted. The positional shift is determined on a random basis. The grid with the processed elements is then used to make an apodization mask. The apodization mask may be used in an optical instrument, such as, an interferometer.

31 Claims, 8 Drawing Sheets

BINARY HALF-TONE PHOTOLITHOGRAPHIC OPTICAL APODIZATION MASK

STATEMENT AS TO RIGHTS TO INVENTIONS MADE UNDER FEDERALLY SPONSORED RESEARCH OR DEVELOPMENT

This invention was made with government support under Contract No. FGHEC3000 pursuant to the Space Interferometry Mission. The government may have certain rights in this invention.

CROSS-REFERENCES TO RELATED APPLICATION(S)

Not Applicable.

BACKGROUND OF THE INVENTION

The present invention relates generally to optical processing, and more specifically, to improved optical processing using an apodization mask.

Apodization masks are employed to softly shape an optical beam in optical instruments, such as, an interferometer. One purpose of using such masks is to prevent diffraction rings from being generated due to hard edge clipping. Hard edge clipping might create interfering signals that can degrade the resulting metrology measurement. FIG. 1 is a simplified schematic diagram illustrating a portion of a pattern used in a conventional apodization mask.

Normal apodization masks are restricted to symmetrical optical density patterns which are created by circular deposition of an opaque material, such as, chrome. The required radial variation in optical density also results in a varying optical path length difference, which can amount to hundreds of nanometers. With interferometers operating in the picometer range, this variation becomes unacceptable.

Conventional apodization masks present at least a number of problems for use with advanced interferometers. For example, interferometers may not necessarily have rotationally symmetric beam shapes. As a result, uniquely shaped mask patterns may be required. Such uniquely shaped mask patterns, however, cannot be fabricated by conventional rotationally symmetric deposition technology. In addition, in very highly resolving interferometric instruments, the varying density is also seen as a varying thickness or optical path length difference and results in an undesirable curved wavefront. Such an undesirable curved wavefront may introduce errors in applications requiring super-precise metrology. Moreover, conventional chemical/ion beam vapor deposition may not be suitable for fabricating a non-rotationally symmetric mask. Furthermore, some apodization masks are created using zig-zap structures which are only partially effective and difficult to manufacture.

Hence, it would be desirable to provide a method and system that may be used to fabricate an improved apodization mask for optical processing.

SUMMARY OF THE INVENTION

The mask edge density of an apodization mask or aperture may vary from 100% transparent to 100% opaque. The density variation is governed by a predetermined mathematical algorithm. Instead of conventionally varying the local optical density of a depositing agent or path length of an attenuating material, an arrangement of elements or dots is employed to create a graded local area density of totally opaque dots and transmissive clear regions. The local dot area number density determines roughly the gross optical transmissivity.

The question of mask shape and edge density gradient is addressed by employing a computer-controlled laser, electron beam photolithographic technology or other etching and milling technology, which allow for the generation of any desired mask shape as well as the precise placement of each and every dot.

Since the clear, transmissive area has a zero optical path length variation over its total area, a beam passing through it will not have its wavefront distorted.

Its creation may be accomplished by photolithographic, electron beam exposure of the desired dot size and density distribution onto a photosensitive emulsion layer overlaying an optically opaque layer. Such an optically opaque layer may include, for example, metal. After exposure and development, the emulsion layer acts as an etching mask to permit the removal by chemical etch of desired portions of the opaque layer. In addition, other means of providing clear and opaque areas may be accomplished by drilling, milling, etching, electroforming or any means of selective removal of material.

The arrangement of the clear or opaque dot diameter and random location of each dot is mathematically determined on a random basis so as not to create any ordered or patterned arrangement. This prevents the dots from acting as a diffraction grating, which would have created regions of coherent addition and subtraction resulting in diffraction rings.

Two types of randomization are employed. The first is threshold randomization. Under threshold randomization, whether a particular dot will be turned on is determined not just by a local chosen optical density, but also by a random number generator. The second is spatial randomization. Under spatial randomization, each and every dot is randomly shifted or offset some fraction of its diameter in any vector in 360 degrees from its original position. This adds an extra breakup to the potential ordering of the dots.

Light intercepting this randomized array of dots is solely attenuated. Any diffraction created by the dots is canceled by the randomized phase summing of any diffracted light. The smoothness and uniformity of the resulting apodization is enhanced by using dot diameters or widths that are roughly the same size as or smaller than the wavelength of light or a type of electromagnetic radiation.

The present invention provides a number of advantages and/or benefits and addresses various limitations inherent to other methods and approaches that have been proposed. For example, diffraction effects are virtually eliminated with no measurable diffraction rings. The degree of apodization and slope can be precisely controlled. No optical path length differences are generated over the full area of the apodization mask.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

BRIEF DESCRIPTION OF THE DRAWINGS

Aspects, advantages and novel features of the present invention will become apparent from the following description of the invention presented in conjunction with the accompanying drawings, wherein.

DESCRIPTION OF THE SPECIFIC EMBODIMENTS

Figure 1:
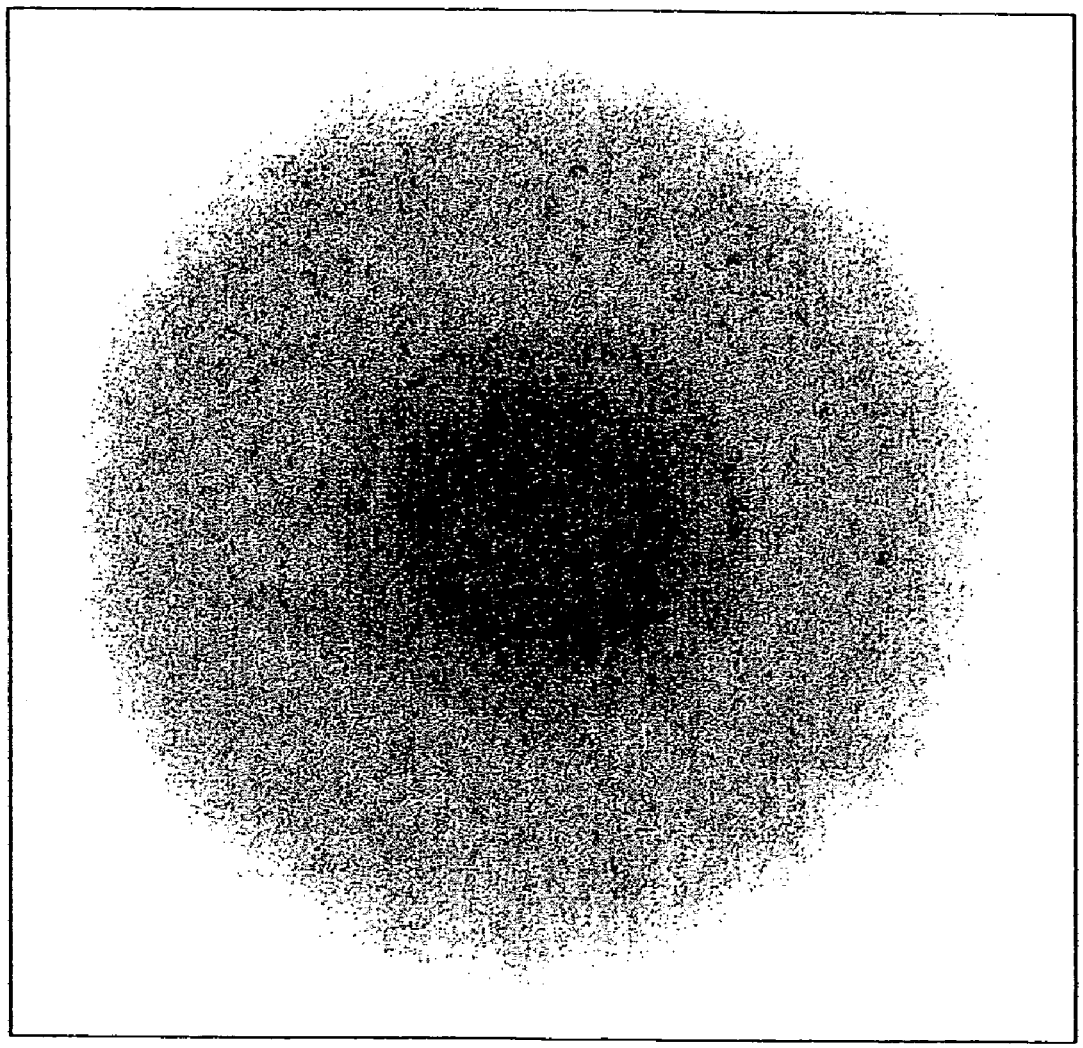
FIG. 1 is a simplified schematic diagram illustrating a portion of a pattern used in a conventional apodization mask.
Figure 2:
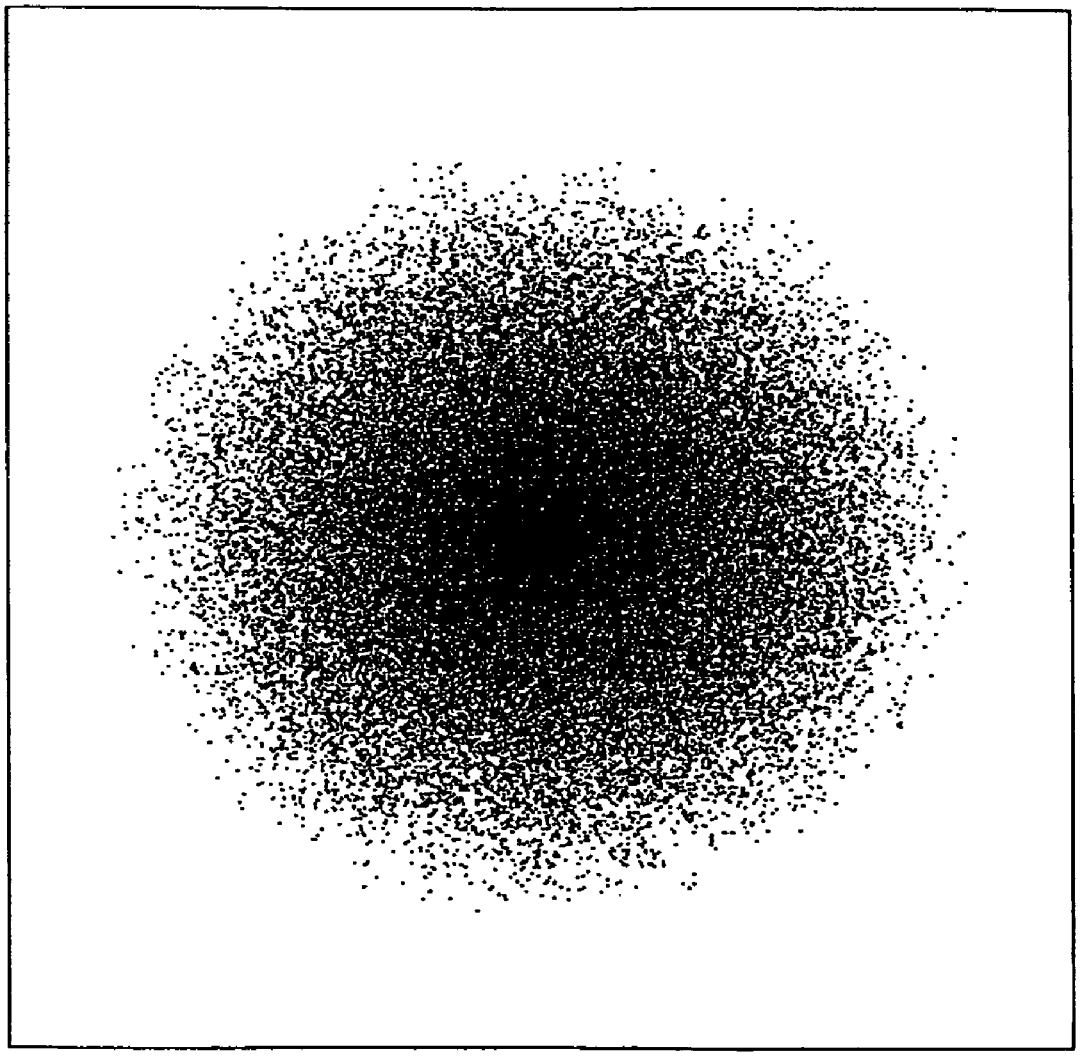
FIG. 2 is a simplified schematic diagram illustrating a portion of a pattern used in an apodization mask according to one embodiment of the present invention.

The present invention in the form of one or more exemplary embodiments will now be described. FIG. 2 illustrates a portion of a pattern 10 generated according to one embodiment of the present invention. The black portions 12 represent opaque regions and the white portions 14 represent transmissive regions. As will be further described below, the pattern 10 may be used to create an apodization mask.

The pattern 10 may be created in the following manner. The pattern 10 initially includes a grid of elements or dots. The size of the grid may be 50 nm, which is a small fraction of the wavelength of visible light (about 500 nm). The shape of the elements may be, for example, round or square. It should be understood that other shapes may be used for the elements. The diameter size of circular or round elements may approximate the wavelength of light or a type of electromagnetic radiation. Based on the disclosure and teachings provided herein, a person of ordinary skill in the art will know how to select the appropriate diameter size according to the present invention.

The elements in the grid are processed based on threshold randomization. Whether a particular element will be turned on, i.e., whether the element is going to be transmissive, is determined by a predetermined local optical density and an associated random value.

The predetermined local optical density is determined by a mathematical function. The mathematical function may include, for example, a Gaussian function or a $Sinc^2$ function. The mathematical function may be selected based on the apodization mask to be created for each specific application. Based on the disclosure and teachings provided herein, a person of ordinary skill in the art will know how to select the appropriate mathematical function according to the present invention.

The predetermined local optical density, in turn, is correlated to a predetermined transmission value associated with each element. The predetermined transmission value associated with each element may vary depending on the predetermined local optical density. For example, if the predetermined local optical density relates to a Gaussian function, elements near the center portion may have a predetermined transmission value that is low, meaning that the probability of such elements being transmissive is low.

The random value associated with a particular element is generated by a random number generator. The random number generator should not yield correlated results. Based on the disclosure and teachings provided herein, a person of ordinary skill in the art will know how to select the appropriate random number generator for use according to the present invention. If the random value for a particular element is less than the predetermined transmission value associated with that particular element, then that particular element is turned on (i.e., the particular element is treated as "white"); otherwise, that particular element is not turned on (i.e., the particular element is treated as "black").

Figure 3:
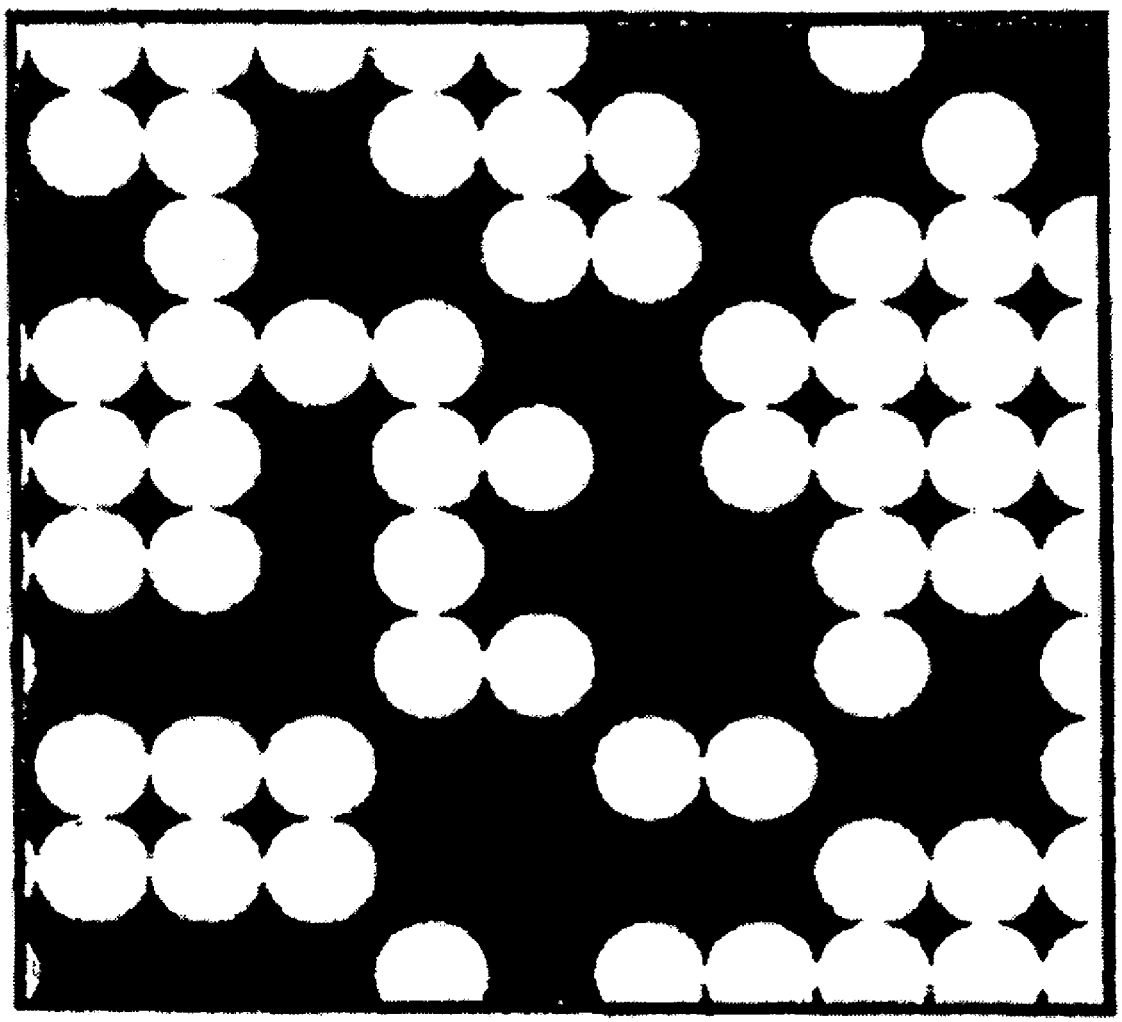
FIG. 3 is a simplified schematic diagram illustrating a pattern that has undergone threshold randomization according to the present invention.

The following is an example illustrating how an element is processed based on threshold randomization. Assume that the predetermined transmission value T associated with the element to be processed has a value of "0.8". Using a uniform random number generator on [0,1], there is an 80% chance that the random value generated will be less than "0.8" and a 20% chance that the random value generated will be greater than "0.8". That means that there is an 80% chance that the element will turn "white" and a 20% chance that the element will turn "black". This also can be interpreted to mean that for all points that have T="0.8", 80% of these points will turn "white" and 20% will turn "black". FIG. 3 illustrates a portion of the pattern 10 that has undergone threshold randomization.

Figure 4:
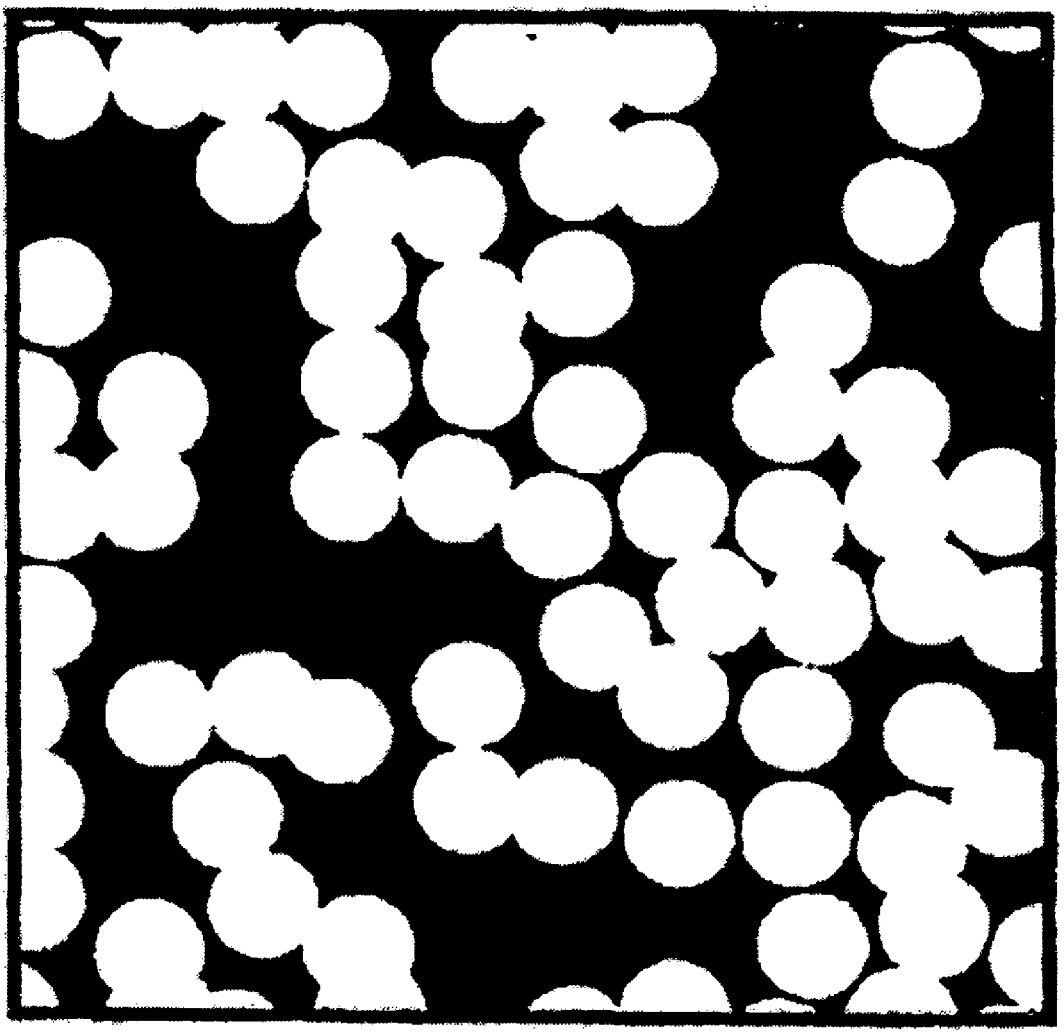
FIG. 4 is a simplified schematic diagram illustrating the pattern as shown in FIG. 3 after undergoing spatial randomization according to the present invention.

After threshold randomization, the elements then further undergo spatial randomization. Under spatial randomization, each element is further adjusted with respect to its location or position. The amount of adjustment is determined on a random basis. The maximum amount of adjustment may be a predetermined value, such as, some fraction of the element's diameter or other parameter. Furthermore, the amount of adjustment can be made in any direction relative to the center of the element. The direction of adjustment is also determined on a random basis. In other words, each element may be shifted or offset from its center position according to a randomly determined amount in a randomly determined direction. FIG. 4 illustrates the same portion of the pattern 10 as shown in FIG. 3 after spatial randomization has been performed.

By performing both threshold and spatial randomization, the average optical density in local regions of the pattern 10 may be varied, thereby achieving a pseudo grayscale.

Figure 5:
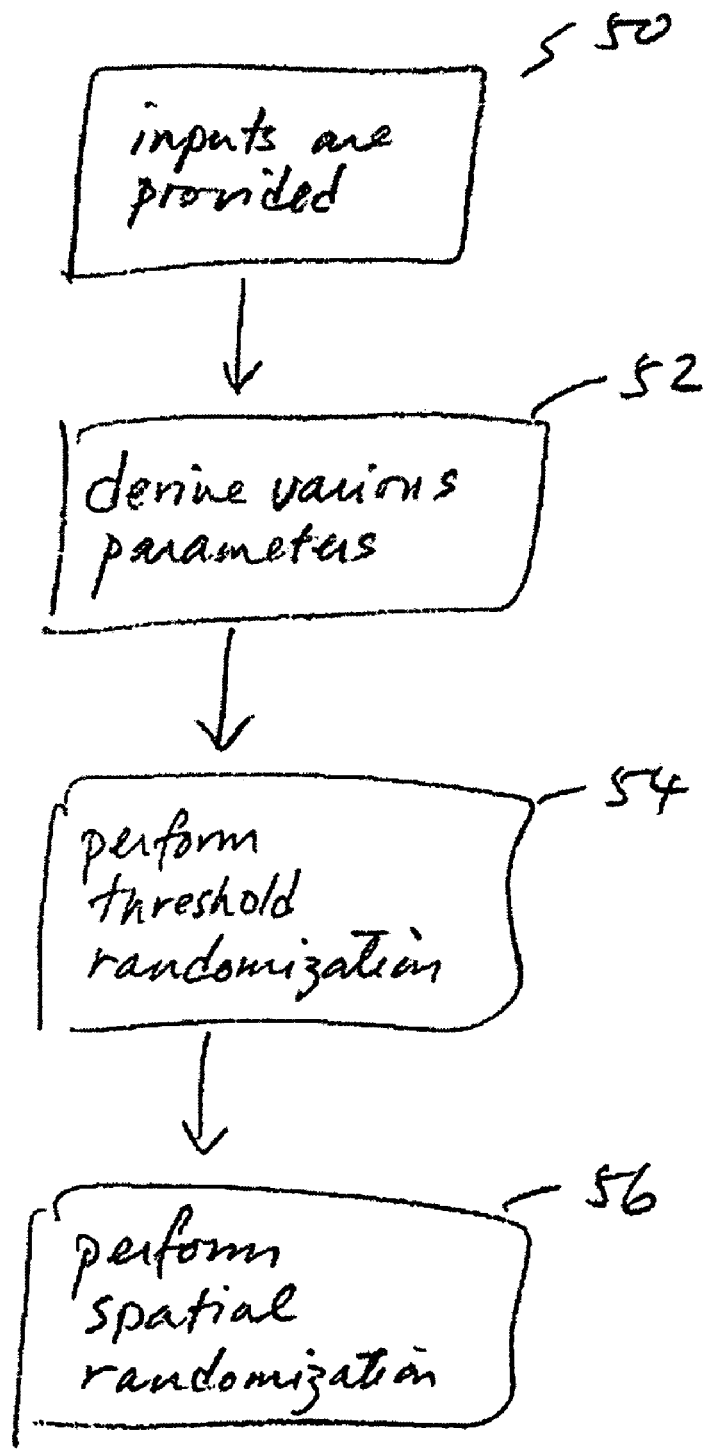
FIG. 5 is a logic flow diagram illustrating how a pattern is created according to one aspect of the present invention.

The above process for creating a suitable pattern for an apodization mask may be computerized. The computerized process may be illustrated as shown in FIG. 5. At block 50, inputs are provided to the computerized process. The inputs to the computerized process may include, for example, dimensions of a grid, a grid spacing size on a specific photolithography machine, radius information on a nominal circular element, center-to-center spacing between elements, amount of overlap (e.g., 20%) of circular element diameter in regions of partial transmission (i.e., predetermined transmission value T is 0<T<1), maximum percentage of diameter for spatial randomization, pattern type (e.g., Gaussian, $Sinc^2$ or linear) and element type (e.g., circle or square). At block 52, various parameters are derived based on the inputs. For example, the grid configuration is determined; the predetermined transmission value for each element is determined; and the maximum amount of spatial randomization is calculated. At block 54, the elements are processed using threshold randomization. At block 56, the elements are further processed using spatial randomization.

The pattern created as described above may then be used to form an apodization mask. For example, glass substrate is first coated with a thin uniform layer of chrome, iron oxide or other etchable or selectively removable opaque or semiopaque layer. Photo resist, which is a light sensitive chemical compound, is then applied to the surface of the chrome or opaque layer.

Figure 6:
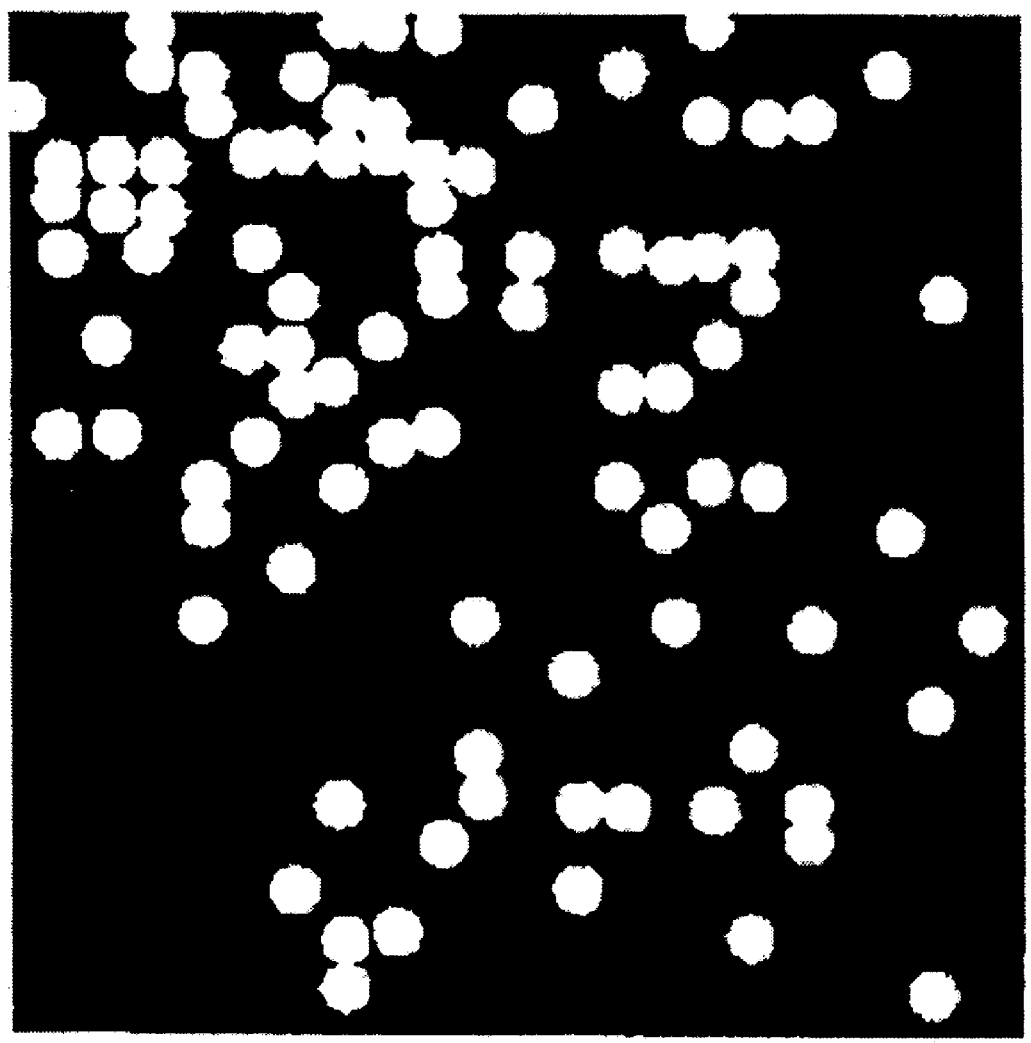
FIG. 6 is a simplified schematic diagram illustrating writing a pattern using positive resist.
Figure 7:
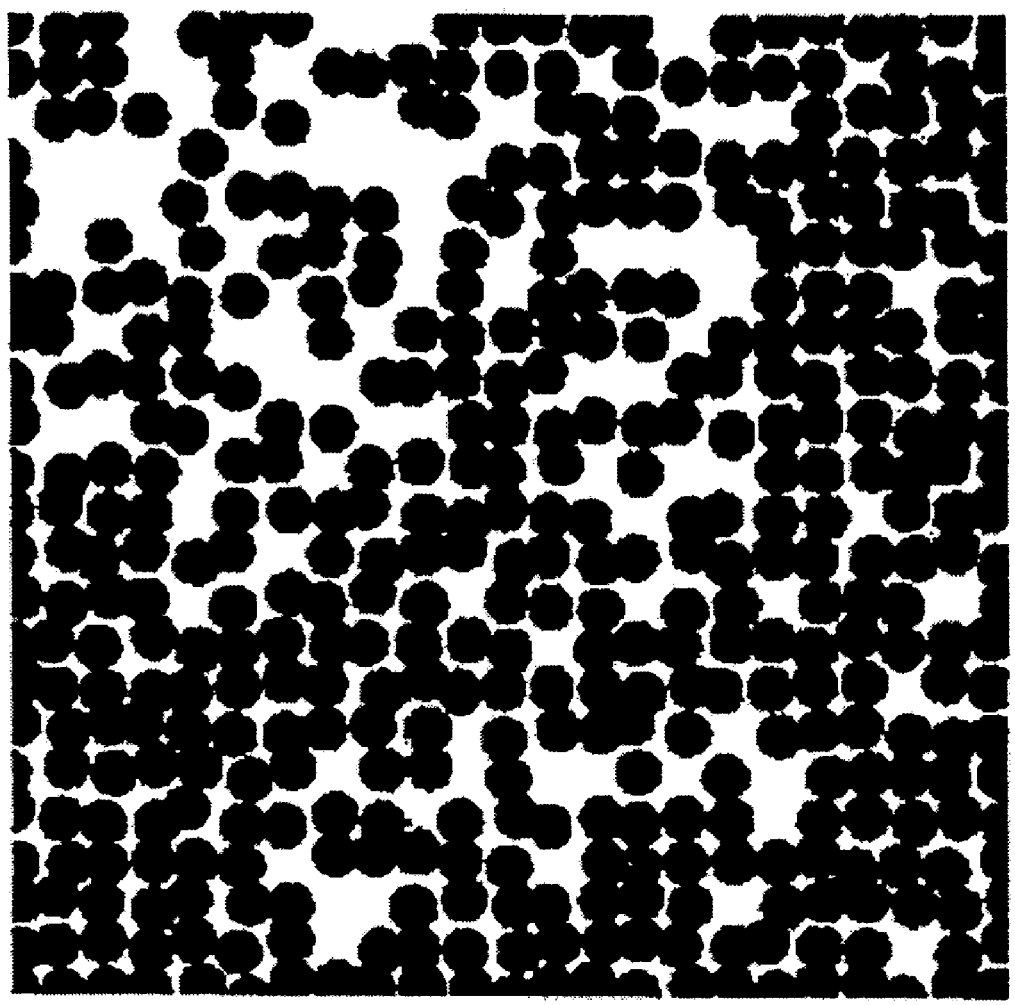
FIG. 7 is a simplified schematic diagram illustrating writing a pattern using negative resist.
Figure 8:
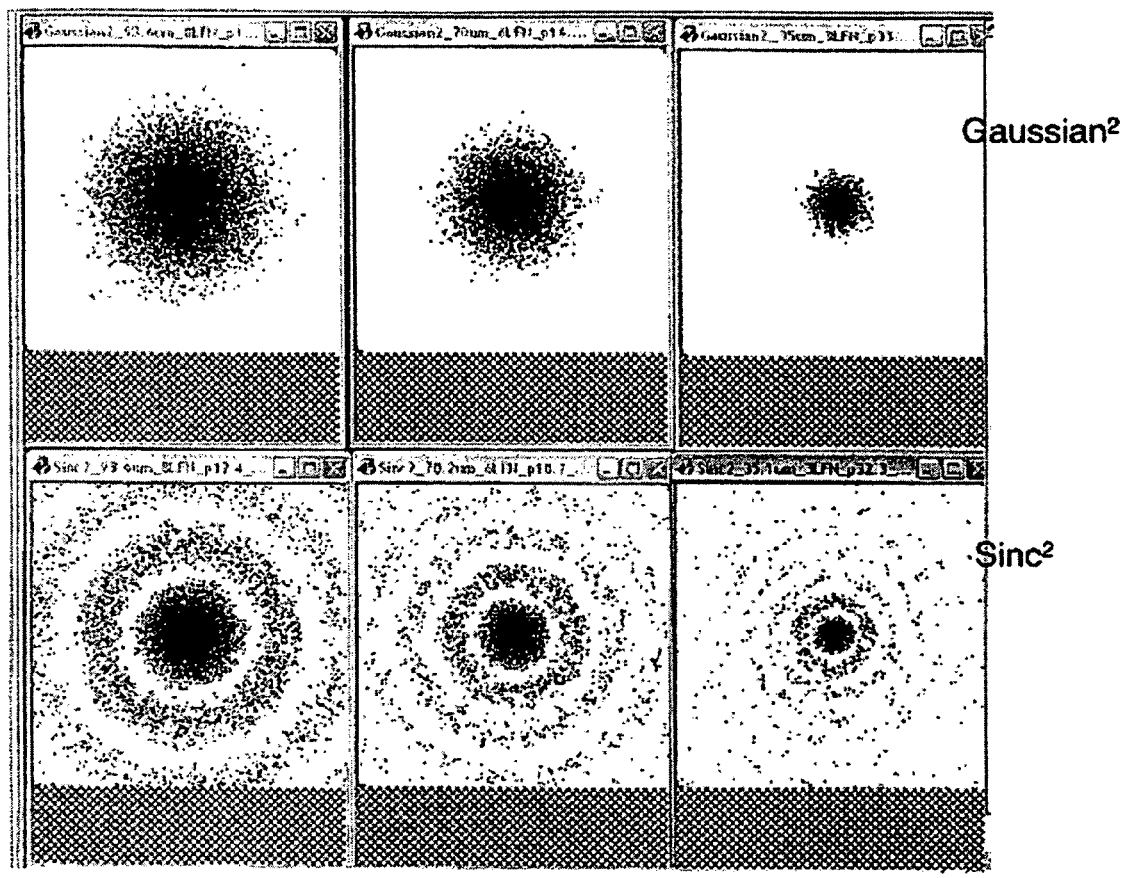
FIG. 8 is a simplified schematic diagram illustrating a number of patterns that can be created according to the present invention.

Laser beam exposes the photo resist while the pattern is written. During the exposure process, the photo resist undergoes a chemical reaction. Depending on the type of photo resist, the photo resist can react in one of two ways when the light strikes the surface. For positive resist, the area exposed will be removed during subsequent etching process. For negative resist, the area exposed will resist etching and the unexposed area will be removed during the etching process. Therefore, depending on the type of resist used, either the black or white elements in the pattern can be written. In other words, the inverse of the pattern may be used. As shown in FIG. 6, writing to white elements (positive resist) yields circular transmissive elements. In contrast, as shown in FIG. 7, writing to black elements (negative resist or inversion of the white element pattern) yields irregularly shaped transmissive elements. FIG. 8 illustrates a number of patterns that can created using the above computerized process.

Based on the disclosure and teachings provided herein, it should be understood that the present invention can be used in a variety of applications including, for example, commercial and/or government spacecraft programs, as well as ground, airborne, aeronautical and astronomical applications. A person of ordinary skill in the art will appreciate other ways and/or methods to deploy the present invention in different types of applications.

It should be understood that the present invention as described above can be implemented in software, hardware, or a combination of both, in the form of control logic in a modular or integrated manner. In the case of software implementation, the control logic may be embodied in a computer-readable medium that is executable by a computer, a processor or other processing devices. Based on the disclosure and teachings provided herein, a person of ordinary skill in the art will appreciate other ways and/or methods to implement the present invention.

The above description is illustrative but not restrictive. Many variations of the present invention will become apparent to those skilled in the art upon review of the disclosure. The scope of the present invention should, therefore, be determined not with reference to the above description, but instead should be determined with reference to the pending claims along with their full scope or equivalents.

What is claimed is:

1. A method for creating an apodization mask, the method comprising:
   creating a grid for a pattern, the grid having a plurality of elements;
   evaluating each of the plurality of elements to determine whether the element is to be made transmissive based on a predetermined local optical density and a random value, wherein the predetermined local optical density and the random value are associated with the element and wherein the random value is generated on a random basis; and
   evaluating each of the plurality of elements to determine whether the position of the element is to be shifted, wherein the positional shift is determined on a random basis.

2. The method of claim 1 wherein the predetermined local optical density is related to a mathematical function.

3. The method of claim 2 wherein the mathematical function includes one of a Gaussian function, a Sinc² function and a linear function.

4. The method of claim 1 wherein the random value is compared to a predetermined transmission value associated with the element.

5. The method of claim 1 wherein each of the plurality of elements is a dot and each has a round shape.

6. The method of claim 5 wherein the diameter of each of the plurality of elements is roughly the same size as or smaller than the wavelength of light or a type of electromagnetic radiation.

7. The method of claim 5 wherein the maximum allowable positional shift is a fraction of the diameter of the element.

8. The method of claim 1 wherein the apodization mask is used in an optical instrument including an interferometer.

9. The method of claim 1 wherein an inverse of a circular dot pattern is used as the pattern so as to create a further randomized shape transmission element.

10. A method for creating an apodization mask, the method comprising:
    creating a grid for a pattern, the grid having a plurality of elements;
    processing the plurality of elements using threshold randomization, wherein each element is processed to determine whether that element is to be made into either a transmissive region or an opaque region based on a predetermined local optical density and a random value, wherein the predetermined local optical density and the random value are associated with the element, and wherein the random value is generated on a random basis; and
    processing the plurality of elements using spatial randomization, wherein each element is processed to determine whether the position of that element is to be shifted, wherein the positional shift is determined on a random basis.

11. The method of claim 10 wherein the predetermined local optical density is related to a mathematical function.

12. The method of claim 11 wherein the mathematical function includes one of a Gaussian function, a Sinc² function and a linear function.

13. The method of claim 10 wherein the random value is compared to a predetermined transmission value associated with the element.

14. The method of claim 10 wherein each of the plurality of elements is a dot and each has a round shape.

15. The method of claim 14 wherein the diameter of each of the plurality of elements is roughly the same size as or smaller than the wavelength of light or a type of electromagnetic radiation.

16. The method of claim 14 wherein the maximum allowable positional shift is a fraction of the diameter of the element.

17. The method of claim 10 wherein the apodization mask is used in an optical instrument including an interferometer.

18. The method of claim 10 wherein an inverse of a circular dot pattern is used as the pattern so as to create a further randomized shape transmission element.

19. A system for creating an apodization mask, the system comprising:
    a first control logic configured to create a grid for the pattern, the grid having a plurality of elements;
    a second control logic configured to evaluate each of the plurality of elements to determine whether the element is to be made transmissive based on a predetermined local optical density and a random value, wherein the predetermined local optical density and the random value are associated with the element and wherein the random value is generated on a random basis; and a third control logic configured to evaluate each of the plurality of elements to determine whether the position of the element is to be shifted, wherein the positional shift is determined on a random basis.

20. The system of claim 19 wherein the predetermined local optical density is related to a mathematical function.

21. The system of claim 20 wherein the mathematical function includes one of a Gaussian function, a Sinc$^2$ function and a linear function.

22. The system of claim 19 wherein the random value is compared to a predetermined transmission value associated with the element.

23. The system of claim 19 wherein each of the plurality of elements is a dot and each has a round shape.

24. The system of claim 23 wherein the diameter of each of the plurality of elements is roughly the same size as or smaller than the wavelength of light or a type of electromagnetic radiation.

25. The system of claim 23 wherein the maximum allowable positional shift is a fraction of the diameter of the element.

26. The system of claim 19 wherein the apodization mask is used in an optical instrument including an interferometer.

27. The system of claim 19 wherein an inverse of a circular dot pattern is used as the pattern so as to create a further randomized shape transmission element.

28. The method of claim 1 wherein each of the plurality of elements is a square and each has a width.

29. The method of claim 1 wherein a desired optical density variation of the mask is achieved with a zero optical path length difference.

30. The method of claim 29, wherein the zero optical path length difference is achieved by creating a transmissive element through selective removal of a material from a layer of uniform thickness on the apodization mask, and wherein the resulting removal of the material from the layer of uniform thickness on the apodization mask maintains the uniform thickness of the layer.

31. The method of claim 29, wherein the zero optical path length difference is achieved by creating an opaque element through selective addition of a material to a layer of uniform thickness on the apodization mask, and wherein the resulting addition of the material to the layer of uniform thickness on the apodization mask maintains the uniform thickness of the layer.

* * * * *